United States Patent
Gouk et al.

(10) Patent No.: US 8,530,356 B2
(45) Date of Patent: Sep. 10, 2013

(54) METHOD OF BARC REMOVAL IN SEMICONDUCTOR DEVICE MANUFACTURING

(75) Inventors: Roman Gouk, San Jose, CA (US); Steven Verhaverbeke, San Francisco, CA (US); Han-Wen Chen, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 13/317,084

(22) Filed: Oct. 7, 2011

(65) Prior Publication Data

US 2013/0089987 A1    Apr. 11, 2013

(51) Int. Cl.
*H01L 21/302* (2006.01)
(52) U.S. Cl.
USPC ............ 438/704; 438/689; 438/706; 216/57; 216/58; 216/73; 216/83

(58) Field of Classification Search
None
See application file for complete search history.

(56) References Cited

U.S. PATENT DOCUMENTS

| | | | |
|---|---|---|---|
| 6,835,668 B2 | 12/2004 | Andreas et al. | 438/745 |
| 6,951,823 B2 | 10/2005 | Waldfried et al. | 438/710 |
| 7,078,351 B2 | 7/2006 | Chiu et al. | 438/736 |
| 7,611,996 B2 | 11/2009 | Schmitt et al. | 438/759 |
| 7,674,755 B2 | 3/2010 | Egbe et al. | 510/175 |
| 7,700,533 B2 | 4/2010 | Egbe et al. | 510/175 |
| 7,790,624 B2 | 9/2010 | Sharma | 438/745 |
| 7,833,957 B2 | 11/2010 | Itano et al. | 510/175 |
| 7,879,782 B2 | 2/2011 | Wu et al. | 510/175 |
| 7,955,782 B2 | 6/2011 | Mukhopadhyay et al. | 430/272.1 |
| 2004/0084412 A1* | 5/2004 | Waldfried et al. | 216/67 |
| 2005/0115671 A1* | 6/2005 | Araki | 156/345.12 |

OTHER PUBLICATIONS

Theo Frot, et al., "Application of the Protection/Deprotection Strategy to the Science of Porous Materials." Advanced Materials, Adv. Mater. 2011, 23, 2828-2832.

* cited by examiner

*Primary Examiner* — Lan Vinh
*Assistant Examiner* — Jiong-Ping Lu
(74) *Attorney, Agent, or Firm* — Shirley L. Church Esq.

(57) ABSTRACT

A method of removing a high molecular weight organic-comprising hard mask or BARC from a surface of a porous low k dielectric material, where a change in the dielectric constant of the low k dielectric material is less than about 5% after application of the method. The method comprises exposing the organic-comprising hard mask or BARC to nitric acid vapor which contains at least 68% by mass $HNO_3$.

16 Claims, 3 Drawing Sheets

METHOD OF BARC REMOVAL IN SEMICONDUCTOR DEVICE MANUFACTURING

BACKGROUND

1. Field

A method of removing a BARC (buried anti-reflective coating or back anti-reflective coating) from an underlying surface without damaging the underlying surface.

2. Description of the Background Art

This section describes background subject matter related to the disclosed embodiments of the present invention. There is no intention, either express or implied, that the background art discussed in this section legally constitutes prior art.

A BARC (buried ARC or back ARC) refers to an anti-reflective coating which is typically used during a photolithography process of the kind commonly used to pattern layers in a semiconductor device. Often, the BARC is a "hard" layer of anti-reflective material which is applied directly over the surface of a layer which is to be patterned. Overlying the BARC is a photoresist which is processed to provide a pattern in the photoresist layer. A plasma etching process is typically used to transfer the pattern from the photoresist layer through the BARC layer, and to other layers underlying the BARC layer.

The photoresist is patterned using imaging radiation, and the BARC reduces radiation reflection back from surfaces underlying the BARC (the reflected radiation deteriorates the pattern image in the photoresist).

The photoresist is typically a "soft" organic material. The BARC may be an inorganic material, but may also be a "hard", high molecular weight organic material in some instances. Often the BARC has chemical structure which not only stops the backward reflection of radiation, but also provides functionality as a hard masking material during transfer of the pattern to surfaces underlying the BARC. In many instances, the surface directly underlying the BARC is a low k dielectric material.

Many of the better low k dielectric materials, having a dielectric constant of about 2.9 or lower, are porous in nature, as the porosity contributes substantially to a reduction in dielectric constant of the dielectric material. The porosity which reduces the dielectric constant also causes the dielectric material to be fragile. The techniques used to remove residual BARC from the low k dielectric materials have damaged the surface of the fragile low k dielectric material. Not only is the structure weakened, but the dielectric constant of the low k dielectric material is often increased by the BARC removal process.

More recent efforts to provide an improved BARC removal process have involved methods of protecting the low k dielectric surface prior to BARC removal and then de-protecting the low k dielectric surface subsequent to BARC removal. These methods require additional steps and result in time loss and increased cost in fabrication of the semiconductor device.

To perform the dual function of anti-reflective coating and hard mask, the chemical composition of a BARC layer is substantially different from that of a photoresist layer, and the techniques used to remove a photoresist layer (oxygen plasma, sulfuric acid-hydrogen peroxide mixture, organic solvents, ozone water, amine-based and hydroxide-based solutions, for example) are either not effective in removing a typical BARC layer or would cause damage to commonly used low k dielectric layers underlying the BARC layer.

The low k dielectric layers are frequently used in contact with a surface of a diffusion barrier layer which prevents migration of conductive materials into adjacent semiconductor or dielectric layers. It is important that there be good adhesion between the low k dielectric layer and the diffusion barrier layer. This is important for device performance integrity. It is also important during fabrication of the devices, because the most commonly used processes for creating "multi-layer metal" devices (i.e. multi-layered connectivity devices which are useful in reducing device size) are damascene processes which make use of flattening, milling processes such as chemical mechanical polishing. These milling processes create stress at interfaces between layers present in the device structure at the time of milling.

The stresses created between device layers during a process such as chemical mechanical polishing (CMP) can deform the device, separate interfacial surfaces, and cause performance defects.

A sampling of low k dielectric materials which have been developed in recent years are described below, for example. This is not an all inclusive list of the background art, but hopefully provides a general understanding of the technology which is improved upon by the present invention.

Schmitt et al. U.S. Pat. No. 7,611,996 B2 describes the deposition of low k dielectric layers using chemical vapor deposition (CVD), and preferably plasma enhanced CVD (PECVD), so that reactant gases used to produce depositing films can be excited by the plasma and a lower temperature is required for film deposition. Another factor affecting the selection of materials to be used for low k dielectric layers is parasitic capacitance between metal interconnects on the same or adjacent layers in a circuit. Parasitic capacitance can result in crosstalk between the metal lines or interconnects and/or resistance-capacitance (RC) delay, thereby reducing the response time of the device and degrading the overall performance of the device. To reduce the parasitic capacitance between metal interconnects on the same or adjacent layers, it has been necessary to change the low k dielectric material used between the metal lines or interconnects to a material having an increasingly lower dielectric constant. A dielectric constant below 2.5 is mentioned as desirable in the Schmitt et al. patent. The material developed to obtain this dielectric constant was a nano-porous silicon oxide film having dispersed microscopic gas voids.

U.S. Pat. No. 7,674,755 to Egbe et al, issued Mar. 9, 2010, describes a formulation for removing photoresist, ion implanted photoresist, etch residue or BARC. The formulation comprises an ammonium hydroxide and a 2-aminobenzothiazole, with the remainder being water. (Abstract) U.S. Pat. No. 7,700,533 to Egbe et al., issued Apr. 20, 2010, describes an aqueous cleaning composition used to remove silicon-containing BARC and/or photoresist residue. The composition comprises from about 0.01% to about 40% by weight of a salt selected from Guanidinium salt, an acetamidinium salt, a formamidinium salt, and mixtures thereof; water; and optionally a water soluble organic solvent. (Abstract)

U.S. Pat. No. 7,879,782 to Wu et al., issued Sep. 7, 2010, describes an aqueous-based composition for removing residues such as post-ashed and/or post-etched photoresist from a substrate. The composition includes water; at least one selected from a hydroxylamine, a hydroxylamine salt compound, and mixtures thereof; and a corrosion inhibitor wherein the composition is substantially free of an added organic solvent, and where the corrosion inhibitor does not contain a water soluble organic acid. (Abstract).

In an *Advanced Materials* article related to removal of hard masking material from low k dielectric surfaces, *Adv. Mater.* 2011, 23, 2828-2832, Theo Frot et al. describe a strategy of introducing protecting groups to protect a porous low k dielectric material surface during key patterning and processing steps, and then deprotecting the low k dielectric material (regenerating the porosity on the surface of the low k dielectric) prior to subsequent device fabrication steps. While this protection-deprotection scheme may be necessary in some instances, it required additional steps which raise the cost of device protection.

The highly porous low k dielectric materials described above are highly susceptible to damage by the kinds of chemical treatments which have been used to remove photoresists and hardmasks in the past, and there is a need for a method of removing BARC materials which requires a minimal number of steps and which will not damage the underlying low k dielectric materials. The present method enables the removal of residual BARC from an underlying layer of low k dielectric material with minimal harm to the dielectric material and at substantial time and cost savings.

SUMMARY

We have discovered that layers of BARC and hard masking materials which include high molecular weight, organic structure, where the BARC layers typically include ring structures of the kind which serve anti-reflective purposes, can be removed from the surface of low-k dielectric materials without harm to such low-k dielectric structures. Examples of porous low k dielectric structures include carbon-doped silicon oxide, fluorinated glass, hydrogen silesquioxane, poly (arylene ether), polyimide, fluorinated polyimide, parylene-N, parylene-F, B-stage polymers, DLC (Diamond-like Carbon) fluorinated DLC, amorphous carbon, fluorinated amorphous carbon PTFE, porous MSQ, porous PAE, porous SiLK, porous $SiO_2$ and combinations thereof, by way of example and not by way of limitation.

A conventional aqueous 65% to 70% (typically 68%) solution of nitric acid is heated to 60° C. to 70° C. to form a vapor which may be used to remove BARC layer residues which are present subsequent to the plasma etching procedures. Typically a surface of a semiconductor wafer on which the BARC film is present is exposed to the nitric acid-comprising vapor for a time period ranging from about 30 seconds to about 60 seconds at room temperature (≈25° C.). After exposure of the BARC or hard mask surface to the nitric acid vapors for the necessary time period, the surface of the wafer is rinsed with deionized water at a temperature ranging from about 20° C. to about 50° C. to remove any BARC, hard mask, or acid-containing moieties.

While additional methods of deionized water application may be used to remove residual nitric acid from the wafer surface, use of a water spray works well, since a good washing action is needed to insure that any residual nitric acid is rapidly removed from the wafer surface.

BRIEF DESCRIPTION OF THE DRAWINGS

FIG. 1A shows the original film stack which includes, from bottom toward top, a silicon substrate (USG) 102, with an overlying layer of a barrier layer for low k dielectric (BLoK) 104, with a layer of black diamond 3 (BD3) low k dielectric 106 overlying the barrier layer 104. A first oxide layer 108 overlies a portion of the low k dielectric layer 106 (the structure comprising layers 102, 104, 106, and 108 had been pre-etched prior to the application of hard masking material over the entire structure). A hard masking layer 110 is present overlying upper surface 109t of the first oxide layer 108, and fills trenches 103 which had been etched through first oxide 108 and through underlying low k dielectric layer 106 prior to the application of hard masking layer 110. A low temperature oxide layer 112 is present overlying the upper surface 111b of hard masking layer 110. Overlying the upper surface 111t of low temperature oxide layer 112 is a layer of BARC 114. Finally, overlying the upper surface 113 of BARC layer 114 is a layer 116 of patterned photoresist.

FIG. 1B shows the portion of the FIG. 1A substrate which remains after a two etch process which removes the patterned photoresist layer 116, the BARC layer 114, the low temperature oxide layer 112, portions of the hard mask 110, and portions of the low k dielectric layer 106.

FIG. 1C shows the portion of the FIG. 1B substrate which remains after removal of the hard masking material 110. Masking material 110 has been removed from surfaces 107 of the low k dielectric layer 106.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

It is well known in the art that the removal of high molecular weight organic hard mask and BARC materials from the surface of a porous low k dielectric material damages the low k dielectric structure, typically increasing the overall dielectric constant of a low k dielectric layer. Various methods have been used to try to remove the organic hard mask and BARC materials, as discussed in the Background Art section above, but these methods either do not adequately remove the hard mask and BARC materials or require multiple expensive steps. We have developed a surprisingly easy method of removing the hard mask and BARC materials which is very cost efficient.

As previously described, the hard masking materials and BARC materials which are removed by the present method include high molecular weight, organic structure, and when the hard mask also functions as a BARC, the organic structure typically includes chromophoric structures which are capable of absorbing the radiation wave lengths which are likely to be reflected back from a device substrate during pattern imaging of a photoresist. The chromophoric structures are frequently aromatic in nature and are found in the form of ring structures, possibly in combination with straight chain sections, where a series of alternating single and double bonds are present.

Since the organic structures useful as hard masks and BARCs need to adhere well to underlying substrates to permit the use of semiconductor processing steps such as chemical mechanical processing, it is not surprising that these organic structures tend to adhere well to the porous surface of a low k dielectric material. This adherence makes it difficult to remove the hard mask or BARC from the surface of the low k dielectric material after a patterning etch process. Examples of porous low k dielectric structures include carbon-doped silicon oxide, fluorinated glass, hydrogen silesquioxane, poly (arylene ether), polyimide, fluorinated polyimide, parylene-N, parylene-F, B-stage polymers, DLC (Diamond-like Carbon) fluorinated DLC, amorphous carbon, fluorinated amorphous carbon PTFE, porous MSQ, porous PAE, porous SiLK, porous $SiO_2$ and combinations thereof, by way of example and not by way of limitation. All of the materials listed above have a k value of 2.9 or less.

Figure 1A:
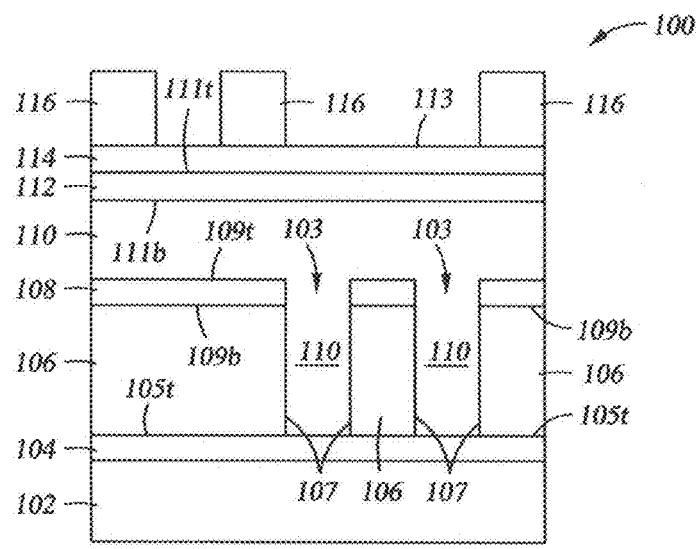
FIGS. 1A through 1C, show the process in which a film stack is etched down to the second trench level, followed by a wet strip to remove residual BARC which remains after the second trench etch.
Figure 1B:
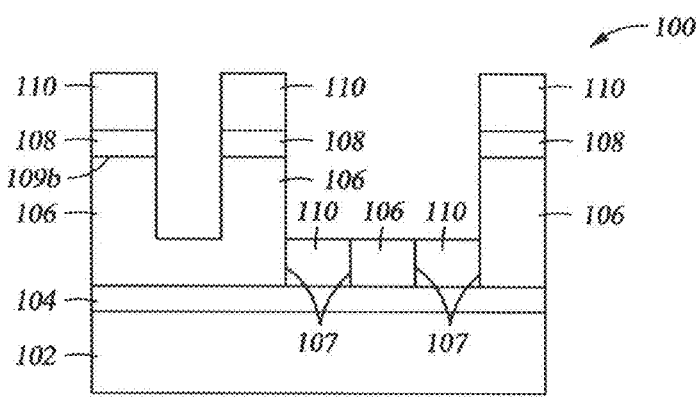
Figure 1C:
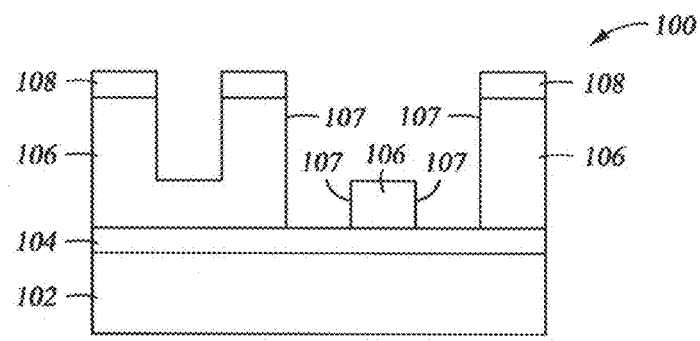

FIGS. 1A through 1C, show a typical semiconductor process in which a film stack is etched down to the second trench level, followed by a wet strip to remove residual BARC which remains after the second trench etch. Because the previously known wet strip techniques tended to damage the low k dielectric materials underlying residual BARC, there have been numerous suggestions in the art that a wet strip cannot be conducted unless the low k dielectric surface is somehow protected during the wet strip. We have surprisingly discovered that a wet strip can be used where the stripping material is permitted to contact the low k dielectric surface if a specialized wet strip reagent is used.

FIG. 1A shows the original film stack which was used for experimentation during development of the present invention. The film stack includes, from bottom toward top, a silicon substrate (USG) 102, with an overlying layer of a barrier layer for low k dielectric (BLoK) 104, with a layer of BD3 low k dielectric 106 overlying the barrier layer 104. A first oxide layer 108 (typically a PECVD oxide) overlies a portion of the low k dielectric layer 106 (the structure comprising layers 102, 104, 106, and 108 had been pre-etched prior to the application of hard masking material over the entire structure). A hard masking layer 110 was present overlying upper surface 109t of the first oxide layer 108, and filled trenches 103 which had been etched through first oxide 108 and through underlying low k dielectric layer 106 prior to the application of hard masking layer 110. A low temperature oxide layer 112 (typically a PECVD oxide produced using a lower annealing temperature) was present overlying the upper surface 111b of hard masking layer 110. Overlying the upper surface 111t of low temperature oxide layer 112 is a layer of BARC 114. The BARC 114 was a polymeric material comprised mostly of naphthalene. Finally, overlying the upper surface 113 of BARC layer 114 was a layer 116 of patterned 193 nm DUV photoresist. The spacing between lines (the width of a trench between lines as shown on the left side of FIGS. 1A-1C) was about 66 nm in size, as an indication of the size of the semiconductor features on the test specimens.

FIG. 1B shows the portion of the FIG. 1A substrate which remains after a two etch process which remove the patterned photoresist layer 116, the BARC layer 114, the low temperature oxide layer 112, portions of the hard mask 110, and portions of the low k dielectric layer 106.

FIG. 1C shows the portion of the FIG. 1B substrate which remains after removal of the hard masking material 110. Hard mask material 110 has been removed from surfaces 107 of the low k dielectric layer 106.

A number of different chemicals were evaluated as potential wet stripping reagents. Although the composition of the JSR HM8006 hard mask material has not been generally published, it is known that this material is an aromatic copolymer which contains naphthalene as a portion of the aromatic structure. In view of this representative composition for an organic hard mask material, a number of BARC stripping reagents were tested. Among the reagents tested were sulfuric acid (96%); nitric acid (68%); commercial EZStrip 601; commercial ElectroStrip LK and LK2; dipolar aprotic solvents: NMP, DMSO, and acetone; polar protic solvents: acetic acid and ethanol; polar aprotic solvent propylene carbonate. The sulfuric acid, commercial EZStrip 601, commercial ElectroStrip LK and LK2, acetic acid, ethanol and propylene carbonate were evaluated using a dip of a substrate to be cleaned into the liquid for 60 seconds at room temperature. The nitric acid was evaluated using a vapor treatment at 50° C. to 100° C. for 60 seconds; the EZStrip 601 was evaluated using a vapor treatment at 70° C. for a time period of 60 seconds; the ElectroStrip LK and LK2 were evaluated using a vapor treatment at 100° C. for 60 seconds; and the propylene carbonate was evaluated using a vapor treatment at 100° C. for 60 seconds. All stripping trials were carried out under a vented hood in ambient air.

Figure 3:
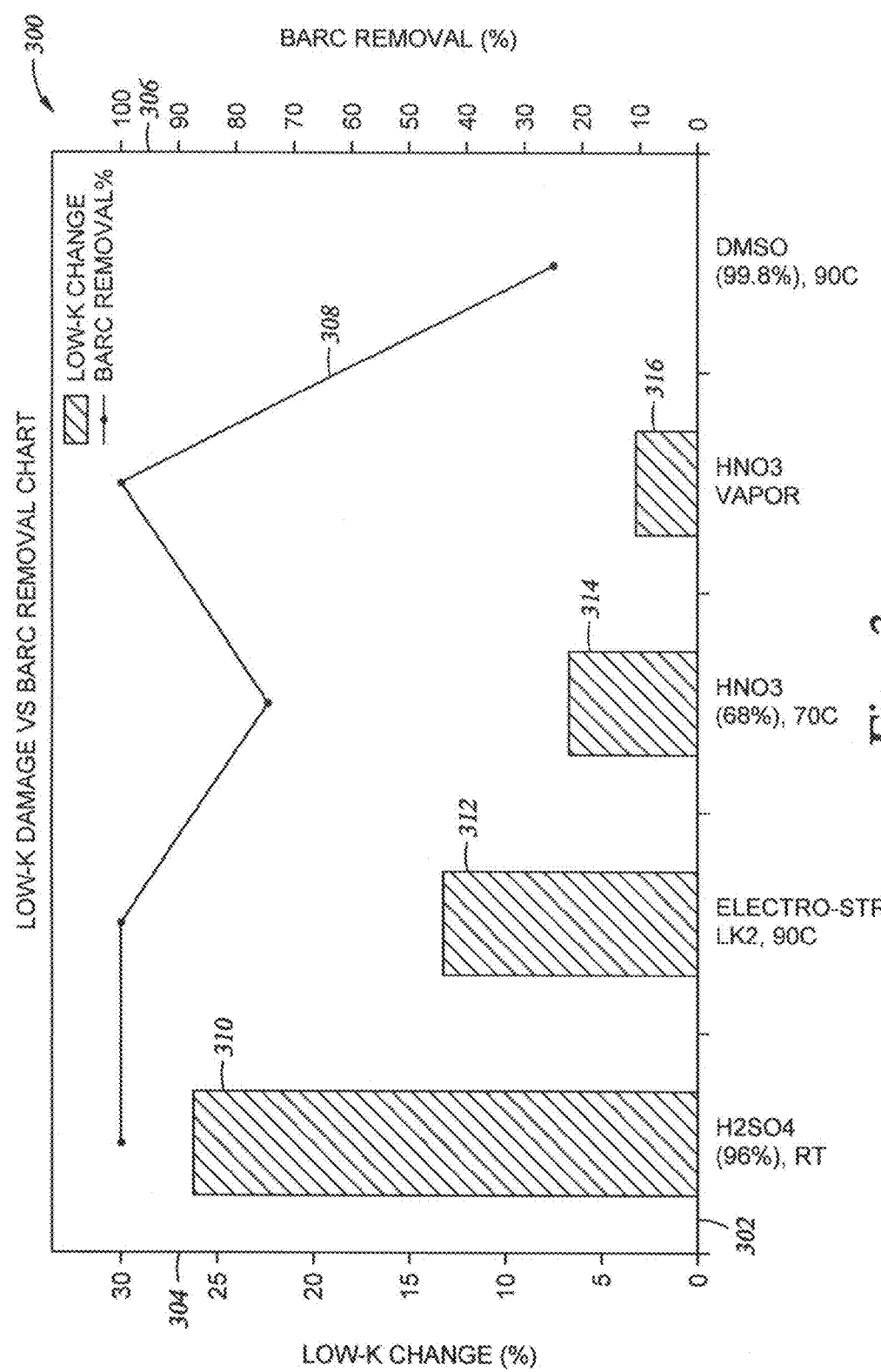
FIG. 3 shows a line graph which illustrates the % BARC removal and a bar graph for % change in the measured overall dielectric constant of the low k dielectric material, for a portion of the stripping reagents which were evaluated.

FIG. 3 shows a line graph which illustrates the % BARC removal and a bar graph for % change in the measured overall change in the dielectric constant of the low k dielectric material. The nitric acid, $HNO_3$ vapor was the only stripping reagent tested which provided 100% BARC removal and a low change in the overall dielectric constant of the low k dielectric layer. Initial trials showed a change in dielectric constant of about 3.5% after BARC removal; however, this number can be reduced substantially using a better post BARC removal rinse step to remove the nitric acid residues as rapidly as possible. The solvent to be used for the rinse is expected to be a dipolar aprotic solvent rather than distilled water.

A conventional aqueous 65% to 68% solution of nitric acid was heated to 60° C. to 70° C. to form a vapor which was used to remove hard mask/BARC layer residues which were present subsequent to the plasma etching procedures. The experimental hard mask material evaluated was JSR HM8006, which is also frequently referred to as a BARC. A surface of a semiconductor wafer on which the BARC film was present, as illustrated in FIG. 1B, was exposed to the nitric acid-comprising vapor for a time period ranging from about 30 seconds to about 60 seconds. The temperature of the semiconductor wafer needs to be such that the nitric acid vapor is condensed on the wafer surface upon contact. A wafer maintained at room temperature condenses the nitric acid-comprising vapor well.

After exposure of the BARC or hard mask surface to the nitric acid vapors for the time period necessary to remove the BARC or hard mask material, the surface of the wafer was rinsed with deionized water at a temperature ranging from about 20° C. to about 50° C. to remove any BARC, hard mask or acid-containing moieties. A rapid removal of acid-containing moieties is important and it is anticipated that the use of a dipolar aprotic solvent followed by a deionized water rinse should be helpful. If a deionized water rinse is used initially, it is helpful to use a high flow spray rinse to avoid acid migration on the substrate surface. Subsequent to application of deionized water, the wafer substrate may be dried in the presence of isopropyl alcohol (IPA) using a drying technique of the kind known in the art as the "Marangoni method" which is related to convection due to temperature and concentration gradients on a free surface.

Since the $HNO_3$ vapor was the promising stripping reagent, and since it was anticipated that there would be concern about the damage to copper wiring within the semiconductor circuit by the migration of residual $HNO_3$ into areas of the integrated circuit, the affect of $HNO_3$ vapor on a copper strip was evaluated. A copper strip having a length of 1 inch, a width of 0.25 inch and a thickness of 0.0014 inch was exposed to an $HNO_3$ dip at room temperature for a 5 second period of time. A copper strip at room temperature having the same dimensions was also exposed to $HNO_3$ vapor for a time period of 60 seconds, where the vapor was generated from 68% $HNO_3$ liquid held at a temperature of 70° C. to 80° C. The vapor was allowed to rise upward from a container to contact the copper strip which was mounter overhead. Condensing vapor was allowed to drip downward from the copper strip.

Figure 2A:
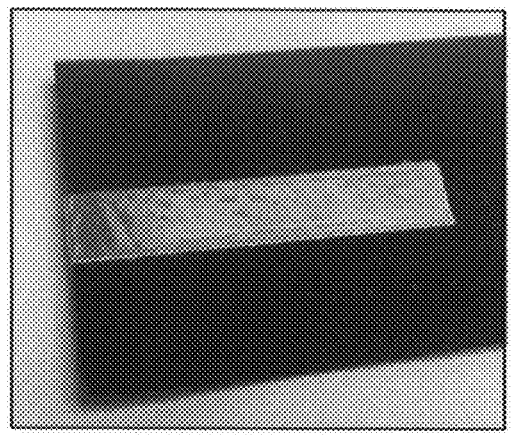
FIG. 2A shows a strip of copper ¼ inch wide, 1 inch long, and 0.0014 inches (1.4 mils) thick in 1.4 mils thick prior to treatment with a chemical which was determined to be useful to remove a hard mask or a BARC from a low k dielectric surface.

FIG. 2A shows a strip of copper prior to treatment with a chemical which was determined to be useful to remove a hard mask or a BARC from a low k dielectric surface.

Figure 2B:
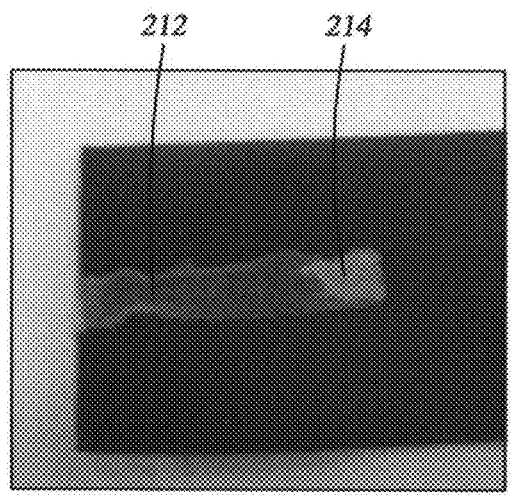
FIG. 2B shows the copper strip of FIG. 2A after a 5 second dip into an aqueous 70% by weight (mass) $HNO_3$ solution.

FIG. 2B shows a copper strip of the kind shown in FIG. 2A after a 5 second dip into an aqueous 70% by weight (mass) $HNO_3$ solution at room temperature. The degree of corrosion of the copper strip is readily apparent from the photographic image shown in FIG. 2A.

Figure 2C:
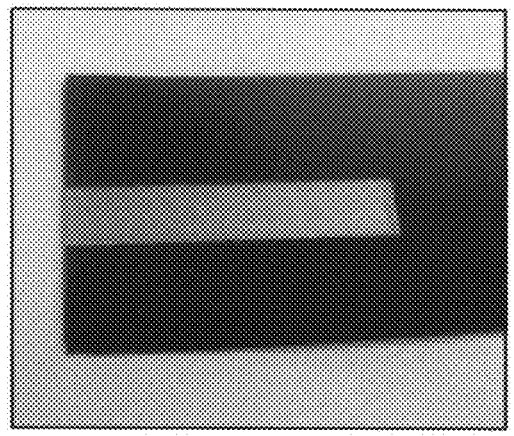
FIG. 2C shows the copper strip of FIG. 2A after a 60 second exposure to an $HNO_3$ vapor created by heating the 70% by weight (mass) $HNO_3$ solution. It is estimated that the $HNO_3$ concentration in the vapor ranged from about 80% to 90% by volume, with the remainder being $NO_x$ and air.

FIG. 2C shows a copper strip of the same material and thickness as the copper strip of FIG. 2A after a 60 second exposure to an $HNO_3$ vapor. The vapor was created by heating the 68% by weight (mass) $HNO_3$ solution to form a vapor and then contacting the copper strip with the vapor in the manner described above with respect to the semiconductor structure, for a time period of 60 seconds. The absence of corrosion is striking. Applicants conducted the experiments regarding the affect of an $HNO_3$ solution versus the affect of the $HNO_3$ vapor to demonstrate that the presence of copper lines within a semiconductor device structure from which a hard mask or BARC is being stripped would not prevent the use of the method of the invention, as the vapor does not propose a threat to the integrity of the device structure as a whole.

It is an unexpected result that the treatment with the $HNO_3$ vapor would remove the BARC in a satisfactory manor and yet not pose a risk to copper wiring within the device structure as a whole.

Procedures which may be used to rinse the semiconductor substrate after the hard mask or BARC structure has been removed may be selected from one of the methods described above. It is important that the residue from the nitric acid vapors be removed rapidly after completion of the BARC removal process.

The above described exemplary embodiments are not intended to limit the scope of the present invention, as one skilled in the art can, in view of the present disclosure, expand such embodiments to correspond with the subject matter of the invention claimed below.

We claim:

1. A method of removing an organic-comprising hard mask or BARC layer from a surface of a porous low k dielectric material present on a semiconductor-comprising substrate, so that a change in overall average dielectric constant of said porous low k dielectric material due to removal of said hard mask or BARC layer is less than about 5%, wherein a substrate on which said hard mask or BARC layer is present overlying a surface of said low k dielectric material is exposed to nitric acid vapor for a time period sufficient to remove said hard mask or BARC layer, followed by an immediate removal of residual acid moieties present after removal of said hard mask or BARC layer.

2. A method in accordance with claim 1, wherein said substrate is maintained at a temperature ranging from about 25° C. to about 30° C. during said hard mask or BARC layer removal.

3. A method in accordance with claim 1 or claim 2, wherein a concentration of said $HNO_3$ in said nitric acid vapor is at least 68% by mass.

4. A method in accordance with claim 1, wherein said change in said overall dielectric constant of said low k dielectric material is less than about 3%.

5. A method in accordance with claim 1 or claim 2, wherein said dielectric constant of said low k dielectric material prior to removal of said hard mask or said BARC is less than about 2.9.

6. A method in accordance with claim 1 or claim 2, wherein said low k dielectric material is selected from the group consisting of carbon-doped oxide, fluorinated glass, hydrogen silesquioxane, poly(arylene ether), polyimide, fluorinated polyimide, parylene-N, parylene-F, B-stage polymers, DLC (Diamond-like Carbon), fluorinated DLC, amorphous carbon, fluorinated amorphous carbon "PTFE", porous MSQ, porous PAE, porous $SiO_2$ and combinations thereof.

7. A method in accordance with claim 1, wherein, subsequent to removal of a source providing $HNO_3$ vapor, said semiconductor substrate is treated with a liquid to remove said residual acid moieties rapidly.

8. A method in accordance with claim 7, wherein, prior to treatment of said substrate with said liquid, said semiconductor substrate surface which has been contacted with said nitric acid vapor is blown dry with nitrogen.

9. A method in accordance with claim 7 or claim 8 wherein said liquid is a dipolar aprotic solvent.

10. A method in accordance with claim 9, wherein said dipolar aprotic solvent is selected from the group consisting of NMP, DMSO, Acetone, and combinations thereof.

11. A method in accordance with claim 9, wherein subsequent to the application of said dipolar aprotic solvent, a deionized water rinse is applied.

12. A method in accordance with claim 11, wherein said application is of said deionized water is by a spray-on technique.

13. A method in accordance with claim 7 or claim 8, wherein said liquid is a dipolar aprotic solvent, and wherein following said aprotic solvent, a deionized water rinse is applied, followed by an isopropyl alcohol dry using a Marangoni drying technique.

14. A method in accordance with claim 7 or claim 8, wherein said liquid is deionized water.

15. A method in accordance with claim 14, wherein said liquid is applied using a spray-on technique.

16. A method in accordance with claim 14, wherein said deionized water is subsequently removed by an isopropyl alcohol dry using a Marangoni drying technique.

* * * * *